(12) United States Patent
Kowarz et al.

(10) Patent No.: US 6,967,986 B2
(45) Date of Patent: *Nov. 22, 2005

(54) LIGHT MODULATION APPARATUS USING A VCSEL ARRAY WITH AN ELECTROMECHANICAL GRATING DEVICE

(75) Inventors: Marek W. Kowarz, Henrietta, NY (US); John A. Agostinelli, Rochester, NY (US); Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 119 days.

This patent is subject to a terminal disclaimer.

(21) Appl. No.: 10/272,547

(22) Filed: Oct. 16, 2002

(65) Prior Publication Data

US 2004/0090599 A1    May 13, 2004

(51) Int. Cl.$^7$ ............................. H01S 3/10; H01S 3/08; G02B 26/00
(52) U.S. Cl. .................... 372/102; 372/26; 359/291
(58) Field of Search ................. 359/558, 559, 359/560, 561, 562, 291, 298; 372/39, 23, 372/19, 26, 101, 102

(56) References Cited

U.S. PATENT DOCUMENTS

| | | | |
|---|---|---|---|
| 5,311,360 A | 5/1994 | Bloom et al. ............... 359/572 |
| 5,381,502 A | 1/1995 | Veligdan ..................... 385/115 |
| 5,761,229 A * | 6/1998 | Baldwin et al. ............. 372/31 |
| 5,982,553 A | 11/1999 | Bloom et al. ............... 359/627 |
| 6,031,561 A | 2/2000 | Narayan et al. ............ 347/255 |
| 6,111,902 A | 8/2000 | Kozlov et al. ............... 372/39 |
| 6,128,131 A | 10/2000 | Tang ........................... 359/443 |
| 6,160,828 A | 12/2000 | Kozlov et al. ............... 372/39 |
| 6,215,579 B1 | 4/2001 | Bloom et al. ............... 359/298 |
| 6,307,663 B1 | 10/2001 | Kowarz ....................... 359/231 |
| 6,330,262 B1 | 12/2001 | Burrows et al. ............. 372/39 |
| 6,396,860 B1 | 5/2002 | Kozlov et al. ............... 372/39 |
| 6,411,425 B1 * | 6/2002 | Kowarz et al. ............. 359/291 |

OTHER PUBLICATIONS

U.S. Appl. No. 09/832,759, filed Apr. 11, 2001, Kahen et al.
U.S. Appl. No. 10/066,829, filed Feb. 4, 2002, Kahen.
U.S. Appl. No. 10/066,936, filed Feb. 4, 2002, Kahen et al.
U.S. Appl. No. 10/171,252, filed Jun. 12, 2002, Kowarz et al.

* cited by examiner

Primary Examiner—Minsun Oh Harvey
Assistant Examiner—Armando Rodriguez
(74) Attorney, Agent, or Firm—Stephen H. Shaw

(57) ABSTRACT

An apparatus for providing modulated light, that includes: a VCSEL array for generating an illumination beam from a plurality of emissive elements within the VCSEL array; a linear array of electromechanical grating devices for modulating the illumination beam to provide a plurality of diffracted orders; an obstructing element for blocking at least one of the plurality of diffracted orders; and means for conditioning the illumination beam to provide a suitable aspect ratio for incidence onto the linear array of electromechanical grating devices and/or remove unwanted spatial content.

101 Claims, 10 Drawing Sheets

LIGHT MODULATION APPARATUS USING A VCSEL ARRAY WITH AN ELECTROMECHANICAL GRATING DEVICE

CROSS-REFERENCE TO RELATED APPLICATIONS

Reference is made to the following commonly assigned disclosures: U.S. patent application Ser. No. 09/832,759 filed Apr. 11, 2001, titled "Incoherent Light-Emitting Device Apparatus for Driving Vertical Laser Cavity" by Keith B. Kahen et al.; U.S. patent application Ser. No. 10/066,936 filed Feb. 4, 2002, titled "Organic Vertical Cavity Lasing Devices Containing Periodic Gain Regions" by Keith B. Kahen et al.; U.S. patent application Ser. No. 10/066,829 filed Feb. 4, 2002, titled "Organic Vertical Cavity Phase-Locked Laser Array Device" by Keith B. Kahen; and U.S. patent application Ser. No. 10/171,252 filed Jun. 12, 2002, titled "High-Contrast Display System with Scanned Conformal Grating Device" by Marek W. Kowarz et al.

FIELD OF THE INVENTION

The present invention relates to imaging and other light modulation apparatus and, more particularly, to an optical apparatus that modulates light from a VCSEL array and an array of electromechanical grating devices.

BACKGROUND OF THE INVENTION

Recent developments in digital imaging include the use of linear arrays which operate as one-dimensional spatial light modulators. Images formed using a linear array are generated one line at a time, then scanned over a surface for display or printing applications. Linear arrays have been recognized to have some inherent advantages over two-dimensional liquid crystal displays (LCD) and digital micromirror displays (DMD) with area spatial light modulators, including the capability for higher resolution, reduced cost, and simplified illumination optics. Particularly where a high degree of color saturation, optimized color gamut, and good light intensity are important, linear arrays of electromechanical grating devices are particularly well-suited for use with laser light sources and are recognized to be, in many ways, superior to their two-dimensional counterparts for modulating laser light. For example, Grating Light Valve (GLV) linear arrays, as described in U.S. Pat. No. 5,311,360, issued May 10, 1994, titled "Method And Apparatus For Modulating A Light Beam," by Bloom et al., are one earlier type of linear array that offers a workable solution for high-brightness imaging using laser sources. U.S. Pat. No. 5,982,553, issued Nov. 9, 1999, titled "Display Device Incorporating One-Dimensional Grating Light-Valve Array," by Bloom et al. discloses a display apparatus that modulates light using a diffractive linear light valve array of electromechanical grating devices.

Recently, an electromechanical conformal grating device that includes ribbon elements suspended above a substrate by a periodic sequence of intermediate supports was disclosed by Kowarz in U.S. Pat. No. 6,307,663, issued Oct. 23, 2001, titled "Spatial Light Modulator With Conformal Grating Device." The electromechanical conformal grating device is operated by electrostatic actuation, which causes the ribbon elements to conform around the support substructure, thereby producing a grating. The device of '663 has more recently become known as the conformal GEMS device, with GEMS standing for Grating ElectroMechanical System. The conformal GEMS device possesses a number of attractive features. It provides high-speed digital light modulation with high contrast and good efficiency. In addition, in a linear array of conformal GEMS devices, the active region is relatively large and the grating period is oriented perpendicular to the array direction. This orientation of the grating period causes diffracted light beams to separate in close proximity to the linear array and to remain spatially separated throughout most of an optical system. When used with laser sources, GEMS devices provide excellent brightness, speed, and contrast, and are capable of providing higher resolution than is available using area, or two-dimensional, spatial light modulators. An example display system using GEMS modulation is disclosed in U.S. Pat. No. 6,411,425, issued Jun. 25, 2002, titled "Electromechanical Grating Display System With Spatially Separated Light Beams," by Kowarz et al.

With the advent of lower cost laser devices, there is considerable interest in using lasers in display and printing applications. As just a few among many examples: U.S. Pat. No. 6,128,131, issued Oct. 3, 2000, titled "Scaleable Tiled Flat-Panel Projection Color Display," by Tang discloses a tiled projection color display using laser sources; U.S. Pat. No. 6,031,561, issued Feb. 29, 2000, titled "Printer System Having A Plurality Of Light Sources Of Different Wavelengths," by Narayan et al. discloses a printing apparatus using lasers for exposing photosensitive media. Continued developments in low cost semiconductor and solid state lasers can be expected to heighten interest in the use of lasers as light sources for these types of imaging applications as well as for scanning, recording, and other uses.

In spite of some promising developments in laser performance, however, there is recognized to be considerable room for improvement. In display applications, for example, where images are formed using three or more light sources having different wavelengths, there are a number of practical constraints. Lasers having suitable wavelengths for display applications, particularly in blue and green spectral regions, can be expensive or difficult to obtain. In printing applications, different sets of wavelengths are required, based on the sensitometric response characteristics of photosensitive media. Printing applications typically demand much higher resolution and overall uniformity than is needed for display or projection applications.

In response to the need for less costly laser sources capable of producing a broad range of wavelengths, laser arrays using organic materials have been developed. U.S. Pat. No. 6,111,902, issued Aug. 29, 2000, titled "Organic Semiconductor Laser," by Kozlov et al.; U.S. Pat. No. 6,160,828, issued Dec. 12, 2000, titled "Organic Vertical-Cavity Surface-Emitting Laser," by Kozlov et al.; U.S. Pat. No. 6,396,860, issued May 28, 2002, titled "Organic Semiconductor Laser," by Kozlov et al., and U.S. Pat. No. 6,330,262, issued Dec. 11, 2001, titled "Organic Semiconductor Lasers," by Burrows et al. disclose types of Vertical Cavity Surface Emitting Lasers (VCSELs) using organic materials. Copending U.S. patent application Ser. No. 09/832,759 filed Apr. 11, 2001, titled, "Incoherent Light-Emitting Device Apparatus For Driving Vertical Laser Cavity," by Kahen et al. and Copending U.S. patent application Ser. No. 10/066,829 filed Feb. 4, 2002, titled, "Organic Vertical Cavity Phase-Locked Laser Array Device," by Kahen also disclose VCSELs having organic-based gain materials with emission in the visible wavelength range. Among advantages of organic-based lasers are lower cost, since the gain material is typically amorphous when compared to gain materials that require a high degree of crystallinity (either inorganic or organic materials). Additionally, lasers based upon organic amorphous gain materials can be fabricated over large areas, without the requirement to produce large regions of single crystalline material; as a result, organic VCSEL arrays can be scaled to arbitrary size. Because of their amorphous nature, organic VCSEL arrays can be fabricated on a wide variety of inexpensive substrates; such as glass, flexible plastics, and silicon and can be more readily tested than conventional semiconductor lasers. Significantly, organic VCSEL arrays are capable of emission over the entire visible range. Optical pumping can be accomplished using low-cost incoherent light sources that are readily available, such as LEDs.

A number of organic VCSEL array characteristics pose problems for use in imaging applications, particularly where a linear spatial light modulator is used. For example, practical, high-power organic VCSEL arrays have aspect ratios that are generally more rectangular than linear. Thus, where higher levels of optical flux are needed, aspherical illumination optics may be required in order to properly shape the illumination beam for a linear spatial light modulator.

A more significant problem relates to the spatial characteristics of the emitted beam from a VCSEL array. Output beam characteristics depend, in large part, on which of two configurations is used. Referring to FIG. 1a, the first configuration, termed an "out-of-phase configuration," is shown. In the plan view of FIG. 1a, a representative portion of a VCSEL array 100 is shown, comprising an arrangement of individual VCSEL emissive elements 102 and 103. In the out-of-phase configuration, alternate VCSEL emissive elements 102 have one phase; their neighboring VCSEL emissive elements 103, shown shaded, have the opposite phase. For comparison, FIG. 1b shows the alternate "phase-locked" configuration for VCSEL array 100. In this phase-locked configuration, each VCSEL cell 102 has the same phase. The VCSEL emissive elements 102 and 103 in FIGS. 1a and 1b are positioned within the VCSEL array 100 so that the axes of symmetry are the horizontal and vertical axes. The axes of symmetry can be any axes in practice.

Referring to FIG. 2a, there is shown a spatial arrangement of the emitted beam with VCSEL array 100 in the out-of-phase configuration of FIG. 1a. Here, instead of providing a single beam, as would be preferred for ease of handling by optical modulation components, VCSEL array 100 emits four first-order lobes 110a, 110b, 110c, and 110d. Lobes 110a–110d have an unequal height-to-width aspect ratio, as approximated in FIG. 2a; the height of each lobe 110a–110d approximates the corresponding length L of VCSEL array 100, as shown in FIG. 1a. A pair of coordinates is assigned to each lobe 110a–110d for reference. Additional, higher-order lobes are also emitted; however, these higher-order lobes contain only a small portion of emitted light and, for a first approximation, can be ignored. At some distance d, near VCSEL array 100, lobes 110a and 110c overlap, as indicated by a shaded overlap area 112a. Referring to FIG. 2b, there is shown the spatial arrangement for the same beam represented in FIG. 2a, but at a distance of 2d from VCSEL array 100. Here, lobes 110a–110d have spread farther apart, do not overlap, and have a slightly more rounded aspect ratio. One can readily recognize that this distribution of emitted light into lobes 110a–110d requires customized beam-shaping optics within the image modulation mechanism of an imaging apparatus.

In contrast to the lobe arrangement of the out-of-phase configuration, the phase-locked configuration provides a more conventional laser beam. Referring to FIG. 3a, a central lobe 110e now contains a relatively high percentage of the emitted light, with additional light among first order lobes 110a–110d and a very small amount of light in higher order lobes (not shown). At a short distance from VCSEL array 100, central lobe 110e overlaps both first order lobes 110a and 110c at overlap area 112a and overlaps first-order lobes 110a and 110c at overlap areas 112b and 112c, respectively. At about twice the distance from VCSEL array 100, as shown in FIG. 3b, overlap areas 112b and 112c diminish in size and may disappear.

Thus, although VCSEL arrays offer some promise as light sources for modulation by electromechanical grating devices, it is recognized that sizable obstacles remain. As is noted above, the range of aspect ratios over which VCSEL arrays provide high power typically differs from the aspect ratio required for illumination of an electromechanical grating device, making some degree of tradeoff necessary. More significantly, spatial characteristics of the modulated light beam can be relatively complex and can vary, depending on whether an out-of-phase or a phase-locked mode of operation is employed. These differences distinguish VCSEL laser arrays from conventional semiconductor laser sources, therefore, there is a need for a solution that addresses the aspect ratio and spatial content of illumination beams emitted from VCSEL laser arrays operating in either an out-of-phase or a phase-locked mode.

SUMMARY OF THE INVENTION

The need is met according to the present invention by providing apparatus and methods for light modulation using a VCSEL array with an electromechanical grating device. From one aspect, the present invention provides an apparatus for providing modulated light that includes: a VCSEL array for generating an illumination beam from a plurality of emissive elements within the VCSEL array; a linear array of electromechanical grating devices for modulating the illumination beam to provide a plurality of diffracted orders; an obstructing element for blocking at least one of the plurality of diffracted orders; and means for conditioning the illumination beam to provide a suitable aspect ratio for incidence onto the linear array of electromechanical grating devices and/or remove unwanted spatial content.

From another aspect, the present invention provides a method for providing a modulated light beam that includes: generating an illumination beam from a VCSEL array with emissive elements; modulating the illumination beam at a linear array of electromechanical grating devices to provide a plurality of diffracted orders; blocking at least one of the plurality of diffracted orders to form the modulated light beam; and conditioning the illumination beam to provide a suitable aspect ratio for incidence onto the linear array of electromechanical grating devices and/or remove unwanted spatial content.

The optical apparatus of the present invention can be used for light modulation within a display apparatus, such as in front or rear projection applications, within a printing apparatus for forming an image onto a photosensitive medium, or within some other type of apparatus that employs modulated light, such as a recording or scanning apparatus, for example.

It is a feature of the present invention that it forms a single line of modulated light at a time, allowing a two-dimensional image to be formed by scanning successive individual lines over an area.

It is an advantage of the present invention that it allows low cost VCSEL arrays to serve as light sources for electromechanical grating devices, thereby providing opportunities for the design of low cost imaging apparatus. For display applications, the present invention takes advantage of the capabilities of organic VCSEL arrays for emission at wavelengths within the visible region.

The present invention takes advantage of inherent capabilities of electromechanical grating devices for modulating light with improved light intensity, high contrast, and high resolution.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figure 1A:
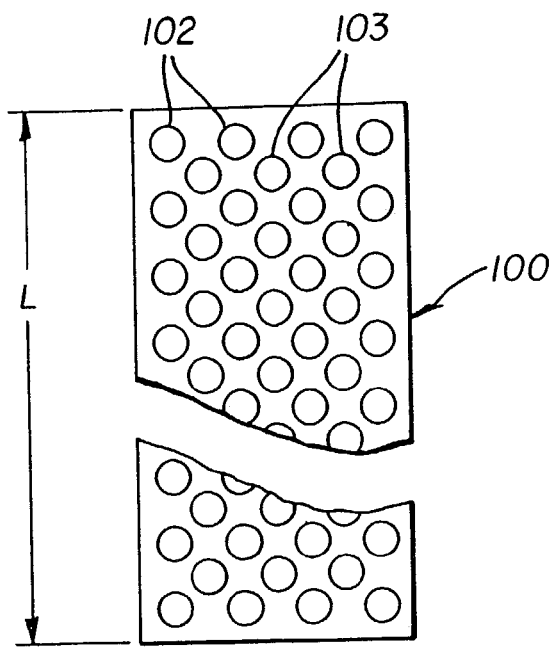
FIGS. 1a and 1b are plan views showing a small portion of a prior art VCSEL array, represented in an out-of-phase and in a phase-locked configuration, respectively.

The present description is directed in particular to elements forming part of, or cooperating more directly with, apparatus in accordance with the invention. It is to be understood that elements not specifically shown or described may take various forms well known to those skilled in the art.

For the description that follows, components specific to a single color path may be more particularly identified with a letter appended to the part number. Where used, letters correspond to color paths; for example, "r" is appended for red, "b" for blue, and "g" for green.

In its broadest embodiment, the apparatus of the present invention provides modulated light, a single line at a time, where the light source is a VCSEL array and the light modulator is an electromechanical grating device. Subsequent description in this section is primarily directed to embodiments for imaging, such as in printing and display apparatus. However, it must be noted that the apparatus of the present invention could be employed in other types of imaging devices, as well as in other apparatus that utilize modulated laser light for a variety of functions, such as sensing or recording functions, for example.

In one embodiment, the apparatus of the present invention is part of an imaging apparatus that forms an image on a surface, which may be a photosensitive medium or may be a projection display screen, either for front or rear projection. It is instructive to note that there can be significant differences between display and printing applications. Projectors are optimized to provide maximum luminous flux to a screen, with secondary emphasis placed on characteristics that are important in printing, such as sensitometric response and resolution. Optical systems for projector and display applications are designed for the response of the human eye, which, when viewing a display, is relatively less sensitive to image artifacts and aberrations and to image non-uniformity, since the displayed image is continually refreshed and is viewed from a distance. However, when viewing printed output from a high-resolution printing system, the human eye is not nearly as "forgiving" to artifacts and aberrations and to non-uniformity, since irregularities in optical response are more readily visible and objectionable on printed output. Even more significant are differences in resolution requirements. Adapted for the human eye, projection and display systems are typically optimized for viewing at lower resolutions than are used for printing. Photographic printing apparatus, for example, must achieve much higher resolution than is needed for display purposes in order to produce images that are essentially of continuous tone quality. For display purposes, the source colors used have a pronounced influence on color gamut. For printing onto a photosensitive medium, however, the wavelengths used must correspond to the sensitometric characteristics of the medium itself, ideal wavelengths may or may not be within the visible region. Contrast between light and dark regions is of paramount concern in display environments, where contrast ratios of 1000:1 or better may be needed. However, for some printing applications, contrast ratios for exposure light as low as 10:1 are often acceptable for obtaining acceptable sensitometric response.

Figure 6:
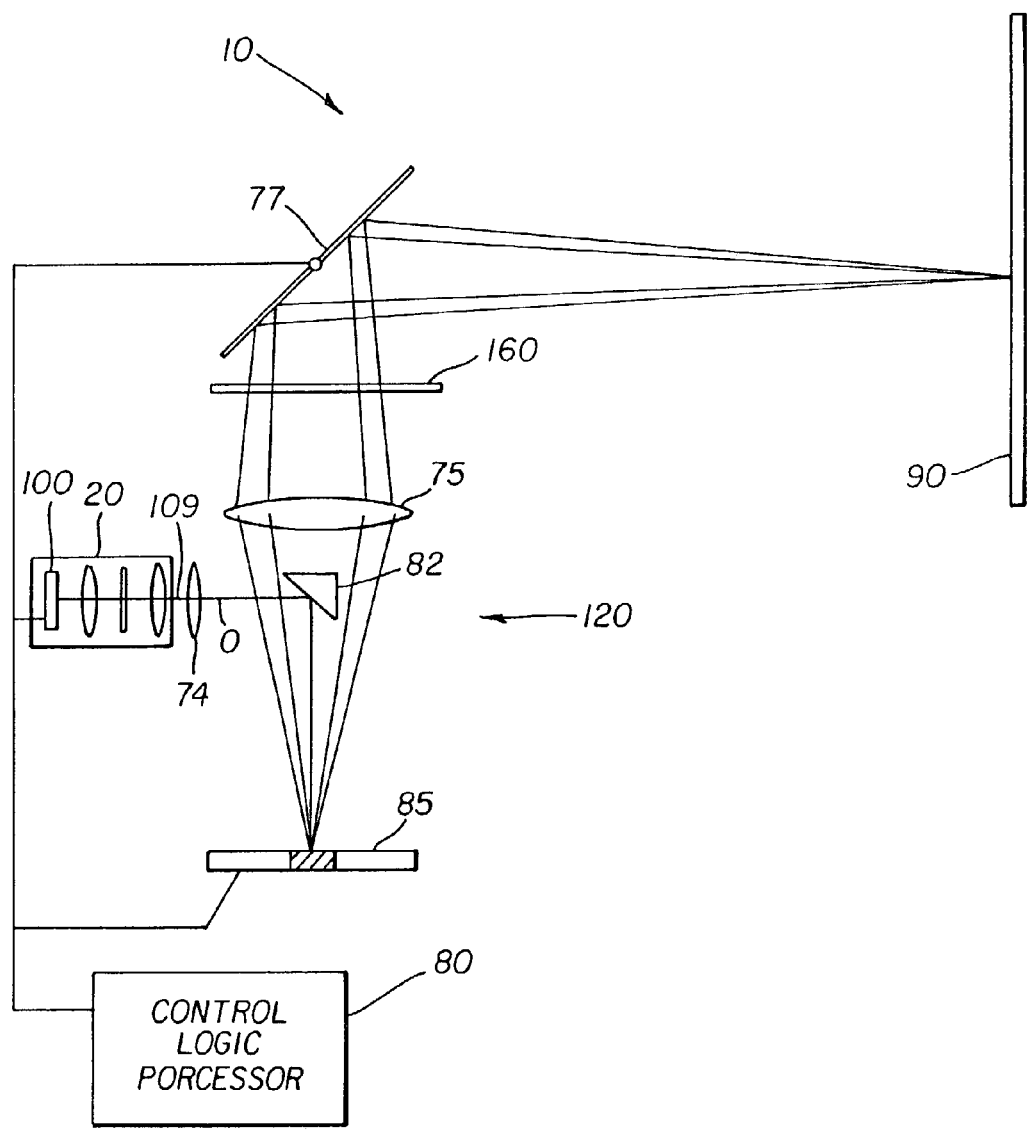
FIG. 6 is a schematic showing a top view representation of optics components operating in an imaging apparatus, according to the present invention.

Referring to FIG. 6, there is shown an imaging apparatus 10 for forming an image onto a surface 90, according to the present invention. A modulation assembly 120 includes a light source 20, cylindrical lens 74 for beam conditioning, a turning mirror 82 for steering, and an electromechanical grating light modulator 85. Light source 20 provides, along an optical illumination axis O, an illumination beam 109 which is conditioned by a cylindrical lens 74 to provide a suitable aspect ratio for incidence onto an electromechanical grating light modulator 85. Light source 20 comprises VCSEL array 100 operating in phase-locked configuration, as was described above with reference to FIG. 1b. The illumination beam 109 along axis O is directed to electromechanical grating light modulator 85 by a turning mirror 82. Modulated light from electromechanical grating light modulator 85 is diffracted past turning mirror 82 and is directed by a lens 75 to a scanning mirror 77. Turning mirror 82 acts as an obstructing element for the zeroeth order reflected light from electromechanical grating light modulator 85.

As scanning mirror 77 rotates, individual modulated line images from electromechanical grating light modulator 85 form a two-dimensional image onto surface 90. A control logic processor 80 provides image modulation data, line by line, to electromechanical grating light modulator 85 according to the position of scanning mirror 77. Optionally, control of light source 20 may also be provided by control logic processor 80. For high optical efficiency and high contrast, the projected line of the image formed on surface 90 is preferably formed from two or more diffracted orders of the modulated light from electromechanical grating light modulator 85.

In a specific embodiment, electromechanical grating light modulator 85 is a GEMS device, but could alternatively be a GLV device, with the necessary rearrangement of components. For example, a GLV-based system would require placement of turning mirror 82 at the Fourier plane of projection lens 75, as is disclosed in the background description of U.S. Pat. No. 6,411,425. Surface 90 is a front projection screen in a specific embodiment; however, similar structure and operation are used for a rear projection display screen or other viewing surface. Alternatively, surface 90 could be a photosensitive medium, such as a photographic film or paper, for example. Other types of photographic media, electrophotographic media, or thermal media might also be used. Lens 75 acts as a projection or print lens; in a practical imaging apparatus 10, a lens assembly comprising a number of lens elements would be used in the position of lens 75. An optional cross-order filter 160 can be placed near a Fourier (focal) plane of lens 75 to minimize projection of undesirable diffracted cross-orders in the modulated light.

Components of Light Source 20

Figure 4:
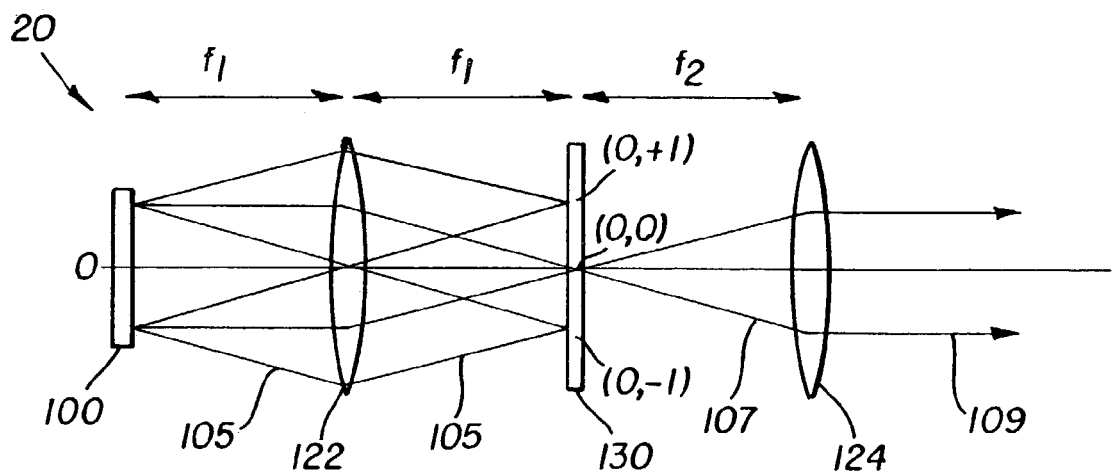
FIG. 4 is a schematic view of a light source using a VCSEL array with a spatial filter for removing unwanted first-order emission from the illumination path.

Referring to FIG. 4, there is shown, in schematic view, an arrangement of components of light source 20, according to the present invention. A VCSEL array 100 includes a plurality of emissive elements 102 and 103 that provide a source beam 105 to a Fourier transform lens 122. Fourier transform lens 122 directs the source beam 105 to an illumination spatial filter 130 that conditions the source beam 105 to remove unwanted spatial content. The conditioned source beam 107 is then collimated by a lens 124 before emerging as illuminating beam 109. Focal lengths $f_1$ and $f_2$ are indicated in FIG. 4, showing the preferred relative spacing for components along the optical axis. Where focal lengths $f_1$ and $f_2$ are equal, 1:1 imaging of VCSEL array is provided by the arrangement of FIG. 4. Magnification would depend on the ratio of focal lengths $f_1$ and $f_2$.

Figure 5A:
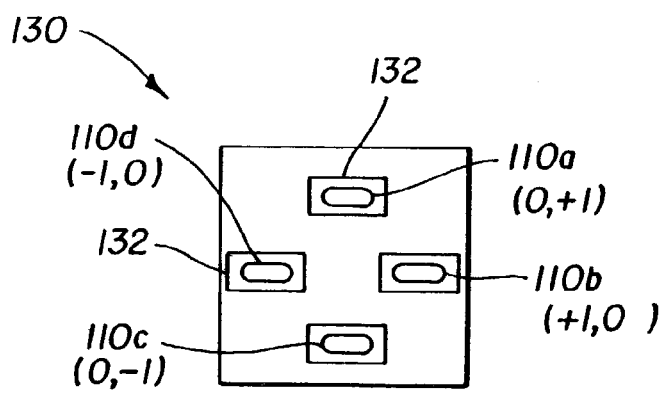
FIGS. 5a and 5b are plan views of spatial filters for out-of-phase and phase-locked VCSEL laser devices, according to the present invention, respectively.
Figure 5B:
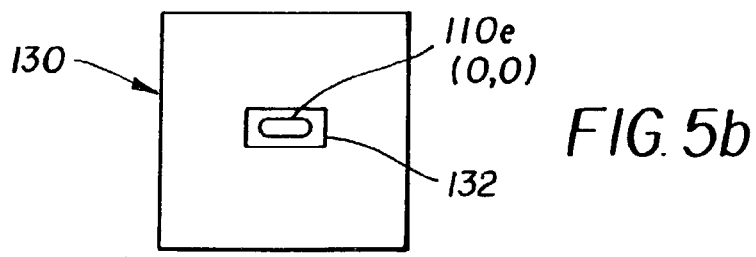

FIGS. 5a and 5b show possible alternative arrangements for illumination spatial filter 130, according to the present invention. As noted in the background section of the present application, VCSEL array 100 may operate in an out-of-phase mode or configuration, as was described with reference to VCSEL emissive elements 102 and 103 in FIG. 1a and to the beam spatial distribution of FIGS. 2a and 2b. For an out-of-phase mode, the configuration of illumination spatial filter 130 is as shown in the plan view of FIG. 5a, with apertures 132 strategically placed to allow transmission of lobes 110a–110d. The shaded area of illumination spatial filter 130 blocks light having unwanted spatial components. Similarly, FIG. 5b shows the configuration of illumination spatial filter 130 for a phase-locked mode, corresponding to the arrangement of FIG. 1b and beam spatial distribution of FIGS. 3a and 3b. In FIG. 5b, a single aperture 132 passes light from central lobe 110e.

Figure 7:
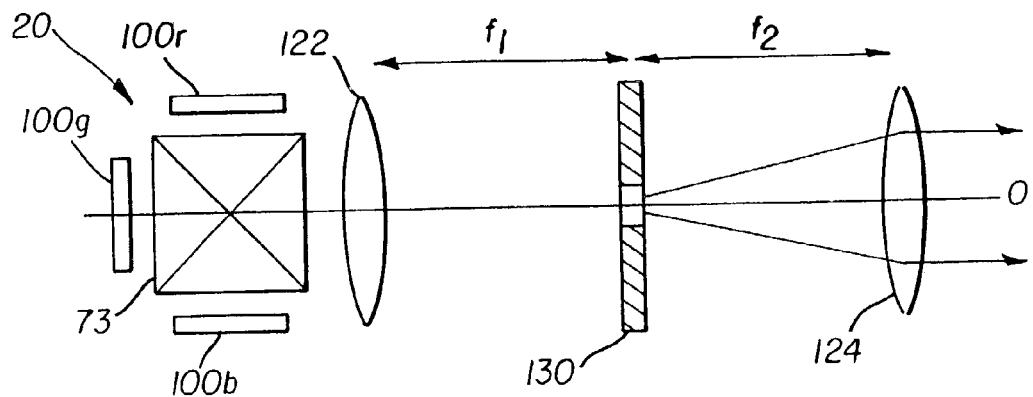
FIG. 7 is a schematic showing a multicolor arrangement, according to the present invention, using multiple VCSEL arrays, one for each color, directed along a single illumination axis.

Referring to FIG. 7, there is shown an alternative arrangement of components of light source 20 for providing an illumination beam for the present invention having, at one time, any one of three colors. A red VCSEL array 100r, a green VCSEL array 100g, and a blue VCSEL array 100b provide light to a color combining element 73. Color combining element 73 then directs the light along a common output optical axis O to Fourier transform lens 122, illumination spatial filter 130, and lastly, collimating lens 124 to provide the illumination beam. Color combining element 73 is an X-cube in one embodiment, but could alternatively be a Philips prism or a suitable arrangement of dichroic surfaces, as is well known in the optical design art.

Embodiments for Color-Simultaneous Imaging

Figure 8:
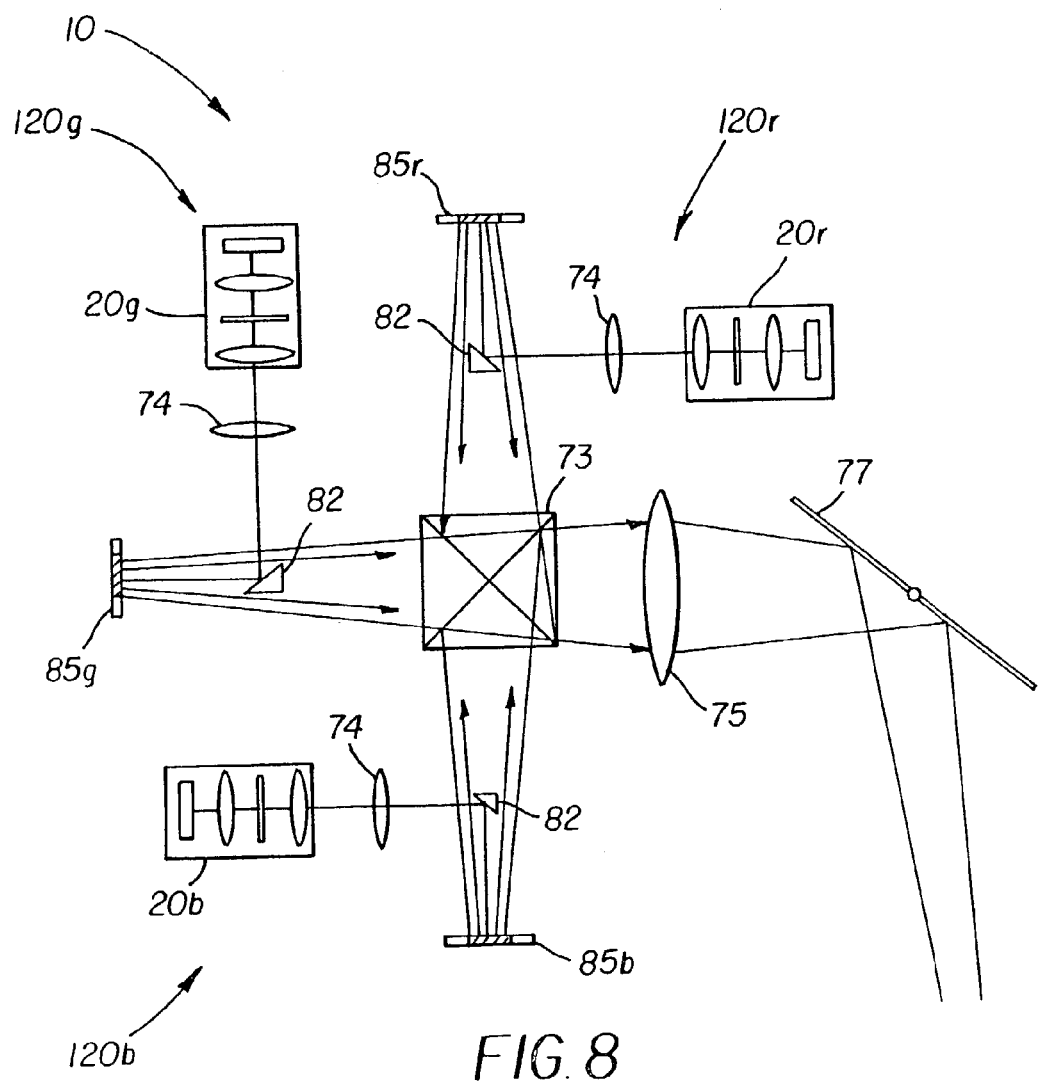
FIG. 8 is a schematic showing a multicolor imaging apparatus, according to the present invention, using separate modulation paths for each color.

Referring to FIG. 8, there is shown an arrangement of imaging apparatus 10, according to the present invention, for color-simultaneous imaging using a phase-locked mode, such as would be employed in a full-color display apparatus, for example. Individual light sources 20r, 20g, and 20b are provided, each in a corresponding red, green, and blue modulation assembly 120r, 120g, and 120b, respectively. Optical components for each light source 204, 20g, and 20b preferably have the basic arrangement shown in FIG. 4. Red light source 20r is directed to a red electromechanical grating light modulator 85r; green light source 20g is directed to a green electromechanical grating light modulator 85g; and blue light source 20b is directed to a blue electromechanical grating light modulator 85b. As is represented within each modulation assembly 120r, 120g, or 120b, one or more diffracted orders can be collected and directed for imaging purposes.

Figure 9:
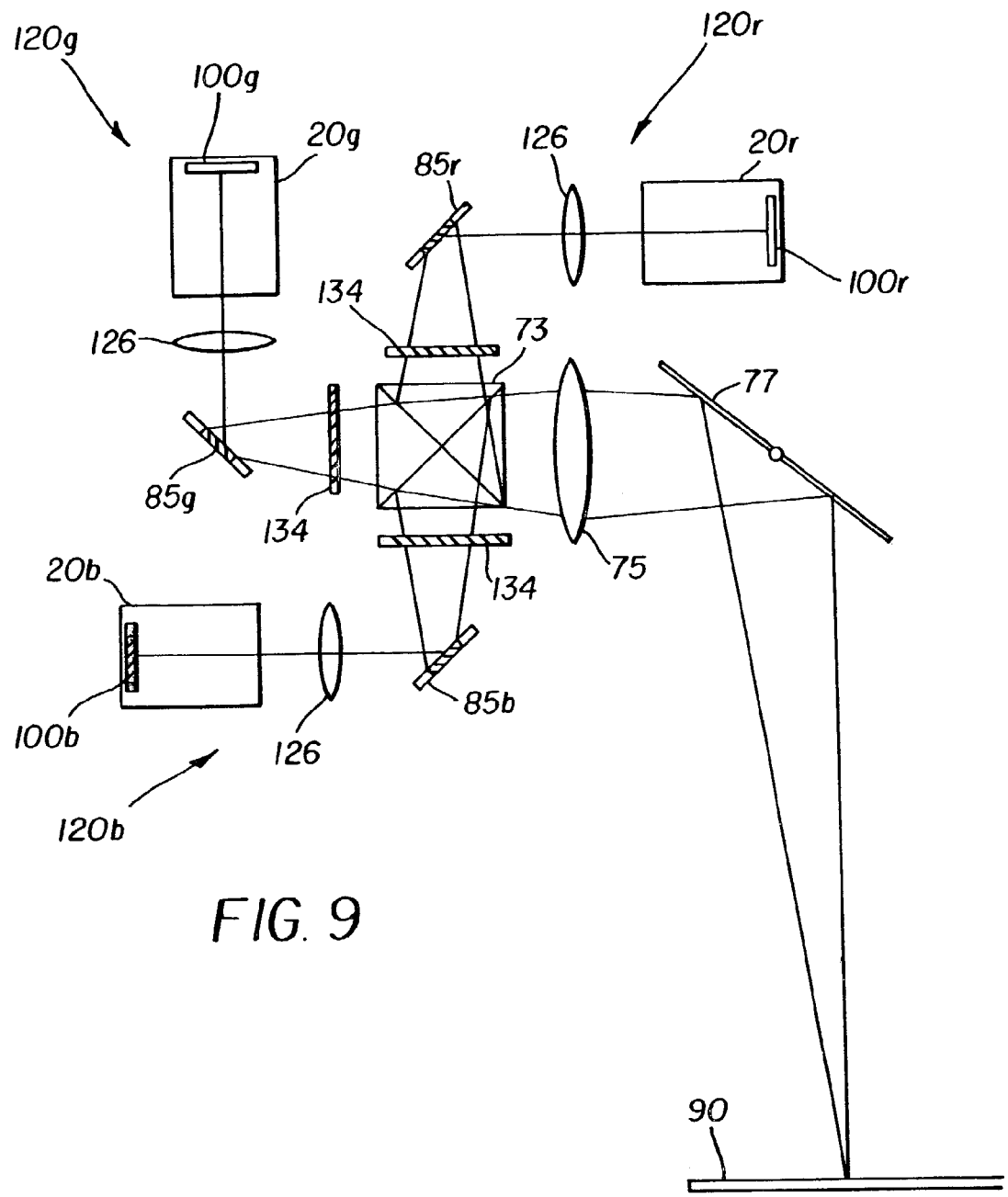
FIG. 9 is a schematic showing an alternate multicolor imaging apparatus, where spatial filtering is performed following light modulation in each color path, according to the present invention.

FIG. 9 shows an alternative arrangement for multicolor, color-simultaneous imaging, according to the present invention, that can be used either for an out-of-phase mode, as was described above with reference to FIGS. 1a, 2a, and 2b or for a phase-locked mode, as was described above with reference to FIGS. 1b, 3a, and 3b. In the arrangement of FIG. 9, electromechanical grating light modulators 85r, 85g, and 85b within each light modulation assembly 120r, 120g, and 120b each are disposed at an oblique angle with respect to their corresponding light sources 20r, 20g, and 20b. This arrangement eliminates the need for turning mirror 82 components for directing illumination onto the electromechanical grating light modulators 85r, 85g, and 85b, respectively. FIG. 9 also shows the simplest possible arrangement of light source 20 components, where light source 20r, 20g, and 20b consist only of the VCSEL array 100; this is shown, for example, in green modulation assembly 120g, where green light source 20g consists of only green VCSEL array 100g. Spatial filtering must be performed at some point in the optical path, either preceding or following modulation. For spatial filtering of the source illumination, each light source 20r, 20g, and 20b may use illumination spatial filter 130, as was described with reference to FIGS. 4, 5a, 5b, and 7. The best arrangement, however, is the deployment of a modulated light spatial filter 134 in each modulated light path, as is shown FIG. 9. In each modulation assembly 120r, 120g, and 120b, a lens assembly 126 forms an image, typically with anamorphic magnification, of a corresponding VCSEL array 100 onto a corresponding electromechanical grating light modulator 85r, 85g, and 85b, respectively.

Figure 1B:
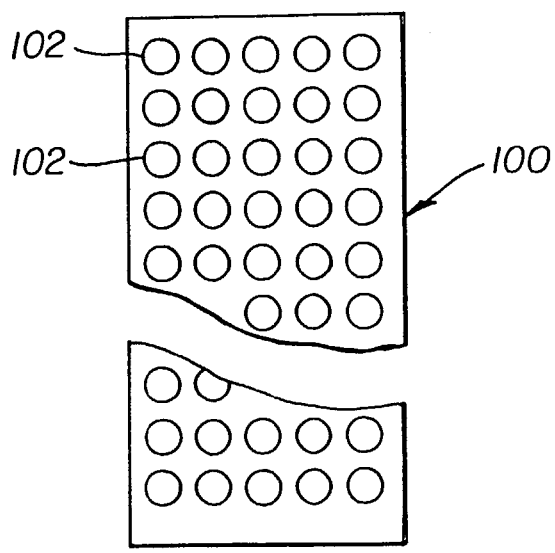
Figure 2A:
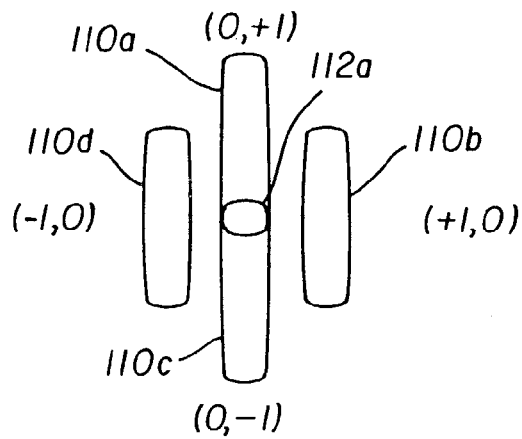
FIGS. 2a and 2b are front views of the emitted beam profile for a prior art VCSEL array at a short distance from the array and at about twice the distance, with the VCSEL array operating in an out-of-phase configuration.
Figure 2B:
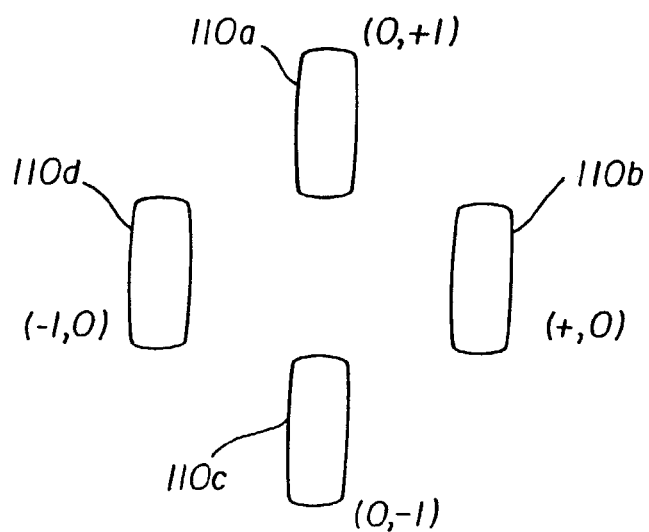
Figure 3A:
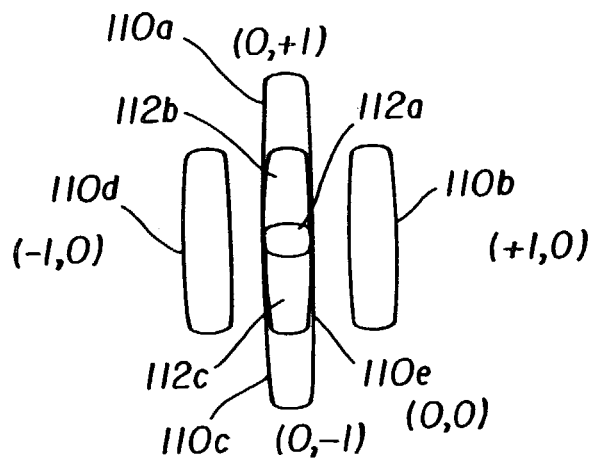
FIGS. 3a and 3b are front views of the emitted beam profile for a prior art VCSEL array at a short distance from the array and at about twice the distance, with the VCSEL array operating in a phase-locked configuration.
Figure 3B:
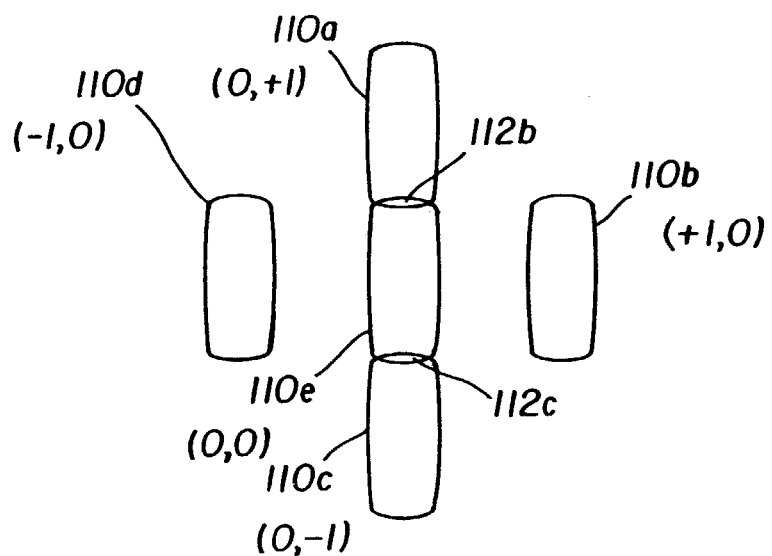
Figure 10:
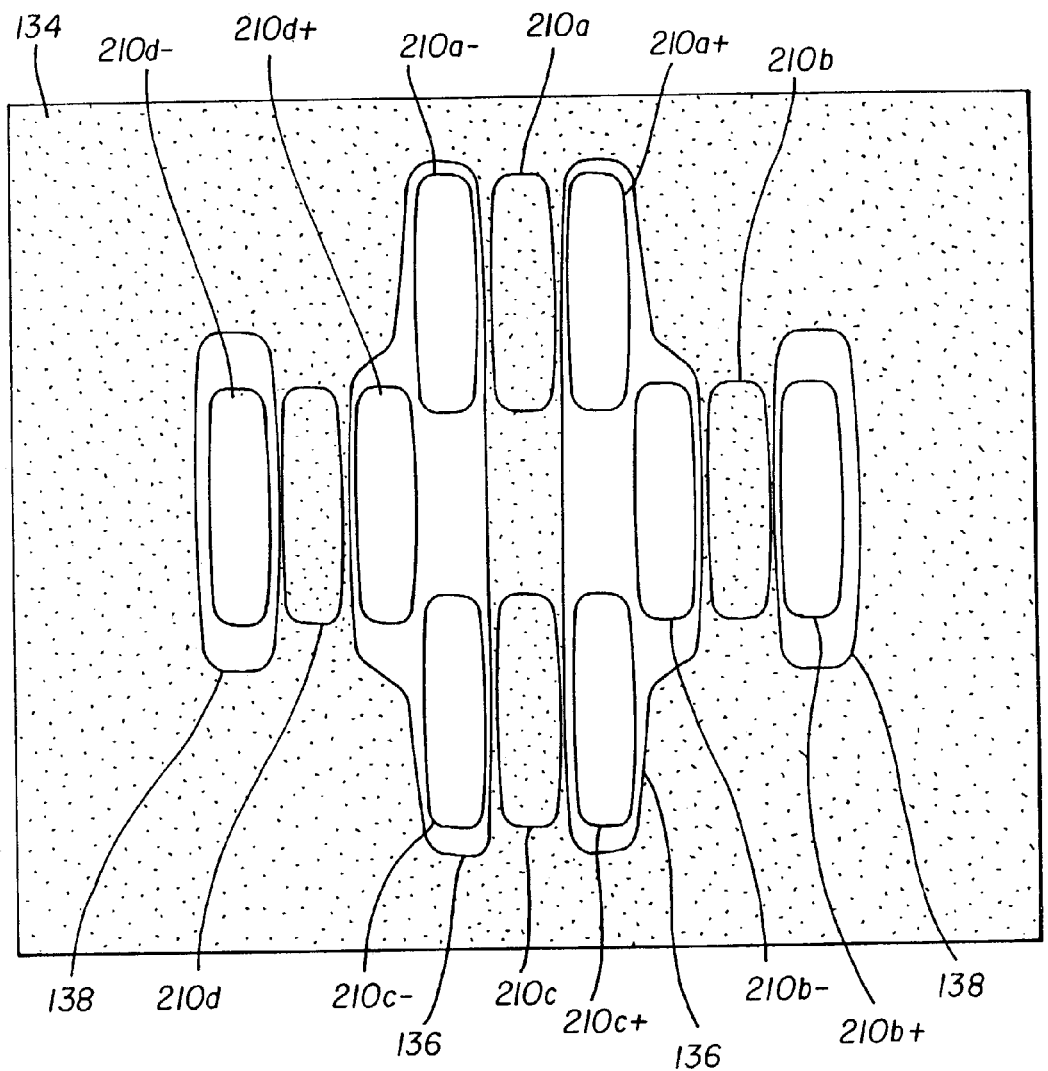
FIG. 10 is a schematic showing an arrangement for a spatial filter, according to the present invention, used in the apparatus of FIG. 9.

FIG. 10 shows one arrangement for modulated light spatial filter 134, according to the present invention, where the source VCSEL array 100 within light source 20 operates in the out-of-phase configuration described with reference to FIGS. 1a, 2a, and 2b. It must be noted that the arrangement of modulated light spatial filter 134 will vary, depending on whether an out-of-phase or a phase-locked mode is used. The position of lobes 110a–110d given in FIG. 2b corresponds with the indicated position of the zeroeth order reflected beams 210a, 210b, 210c, and 210d represented in FIG. 10. Therefore, in the arrangement of FIG. 9, modulated light spatial filter 134 in each color path blocks each of the zeroeth order reflected beams 210a–210d from being directed to the color combining element 73 shown in FIG. 8. Modulated light, on the other hand, is the light diffracted from electromechanical grating light modulator 85 that appears in pairs of modulated, diffracted orders 210a+/210a−, 210b+/210b−, 210c+/210c−, and 210d+/210d−, as indicated in FIG. 10. That is, the pair of diffracted orders 210a+ and 210a− contain the first order diffracted light that results from modulation of lobe 110a by electromechanical grating light modulator 85. Similarly, diffracted orders 210b+ and 210b− contain first order diffracted light corresponding to lobe 110b; diffracted orders 210c+ and 210c− contain first order diffracted light corresponding to lobe 110c; and diffracted orders 210d+ and 210d− contain first order diffracted light corresponding to lobe 110d. Apertures 136 and 138 are dimensioned and spaced to pass diffracted orders 210a+, 210a−, 210b+, 210b−, 210c+, 210c−, 210d+, and 210d−, as shown. It must be noted that only the first order diffracted light is used with the arrangement of modulated light spatial filter 134 shown in FIG. 10. Where higher orders of diffracted light are used, the arrangement of modulated light spatial filter 134 would be considerably more complex.

Reflected Light Mode

The arrangement of apertures 136 and 138 used in modulated light spatial filter 134 is suitable for passing diffracted orders 210a+, 210a−, 210b+, 210b−, 210c+, 210c−, 210d+, and 210d−. However, an inverse, reflected light imaging mode could alternatively be used, in which apertures 136 and 138 are replaced by opaque stops and the opaque portions of modulated light spatial filter 134 are transparent instead. (This would be substantially equivalent to adapting illumination spatial filter 130, which was originally designed for placement in the illumination light path with the arrangement shown in FIG. 5a, to the modulated light path instead.) With such an alternative arrangement, only the zeroeth order light reflected from electromechanical grating light modulator 85 is directed to surface 90. Non-zero diffracted orders are blocked. With this type of imaging, the modulated light path does not include light that is diffracted to ±1 or higher orders; only the reflected, zeroeth order light is used in the reflected light mode. While a reflected light imaging mode may not be suitable for some types of imaging devices, due to contrast requirements, there are low-contrast imaging applications for which a reflected light imaging mode can be used with imaging apparatus 10. Suitable uses for the reflected light imaging mode may include some printing applications that require high efficiency and only low to moderate contrast, for example. For the out-of-phase configuration, the arrangement of components shown in FIG. 9 could be readily adapted for reflected light imaging operation, with modulated light spatial filter 134 having an inverse arrangement from that shown in FIG. 10. For reflected light imaging operation in the alternative phase-locked configuration, the overall arrangement of FIG. 9 could be used, with spatial filter 134 modified to have only a single central aperture.

Correcting Aspect Ratio of VCSEL Emission

Electromechanical grating light modulator 85 has a high height-to-width aspect ratio and requires an incident illumination beam having substantially the same aspect ratio. For applications requiring incident illumination with relatively low optical flux, the VCSEL array 100 can be fabricated with a high height-to-width aspect ratio. In such applications, conventional spherical optics can be used to image the VCSEL array 100 onto electromechanical grating light modulator 85 with the appropriate magnification. However, as was noted in the background section above, the VCSEL array 100 provides higher light flux levels when dimensioned with a more rectangular aspect ratio. To provide higher flux illumination, then anamorphic optics must be employed for aspect ratio conversion as the VCSEL array 100 is imaged to the electromechanical grating light modulator 85. For example, cylindrical lenses may be used for this purpose. Anamorphic magnification up to a range of about 10:1 may be achieved using conventional techniques well known in the imaging arts.

Figure 11:
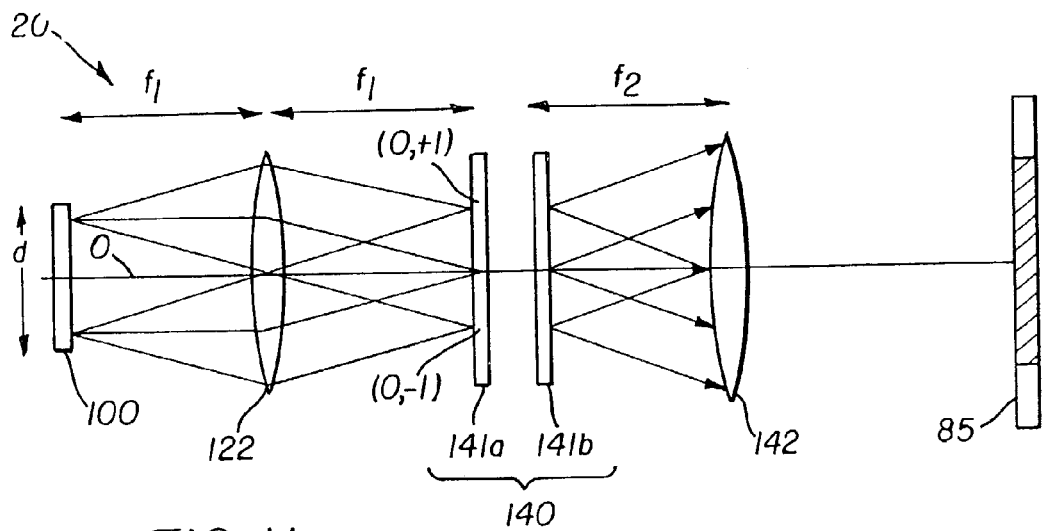
FIG. 11 is a schematic showing a configuration of optical components for correcting the aspect ratio of light emitted from a VCSEL array, according to the present invention.

In some applications, even larger values of effective anamorphic magnification are required. Referring to FIG. 11, there is shown an alternative arrangement of the light source 20 that provides an additional measure of anamorphic magnification, according to the present invention. Light emitted from the VCSEL array 100 is directed to a microlens converter 140 by Fourier transform lens 122. The light that is input to microlens converter 140 has the overall arrangement of lobes 110a–110d represented in FIG. 12a. Microlens converter 140 comprises a cylindrical lens array 141a and a collimator lens array 141b that cooperate to alter the aspect ratio of the emitted light. A lens 142 directs the light to electromechanical grating light modulator 85. Focal lengths $f_1$ and $f_2$ of Fourier transform lens 122 and lens 142 are as indicated. With this arrangement, microlens converter 140 is positioned in the Fourier plane of Fourier transform lens 122. At this Fourier plane position, significant modification of the emission pattern is possible, as is well known in the optical arts.

Figure 12A:
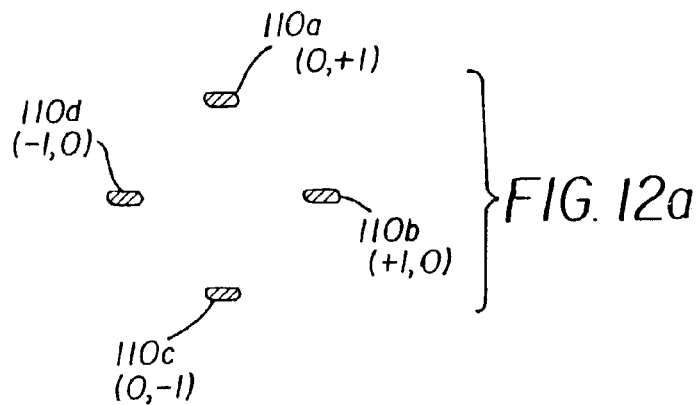
FIGS. 12a and 12b show VCSEL lobes before and after beam shaping by the arrangement of FIG. 11, according to the present invention; and, FIGS. 13a and 13b show an embodiment of microlens arrays used for the microlens converter of FIG. 11, according to the present invention.
Figure 12B:
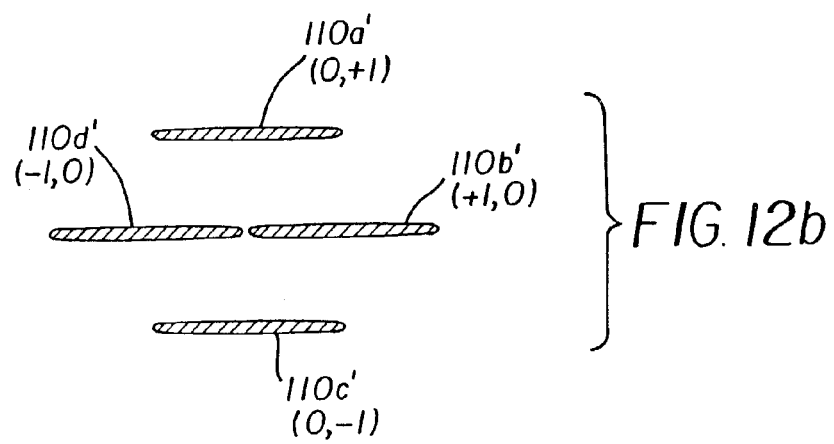
Figure 13A:
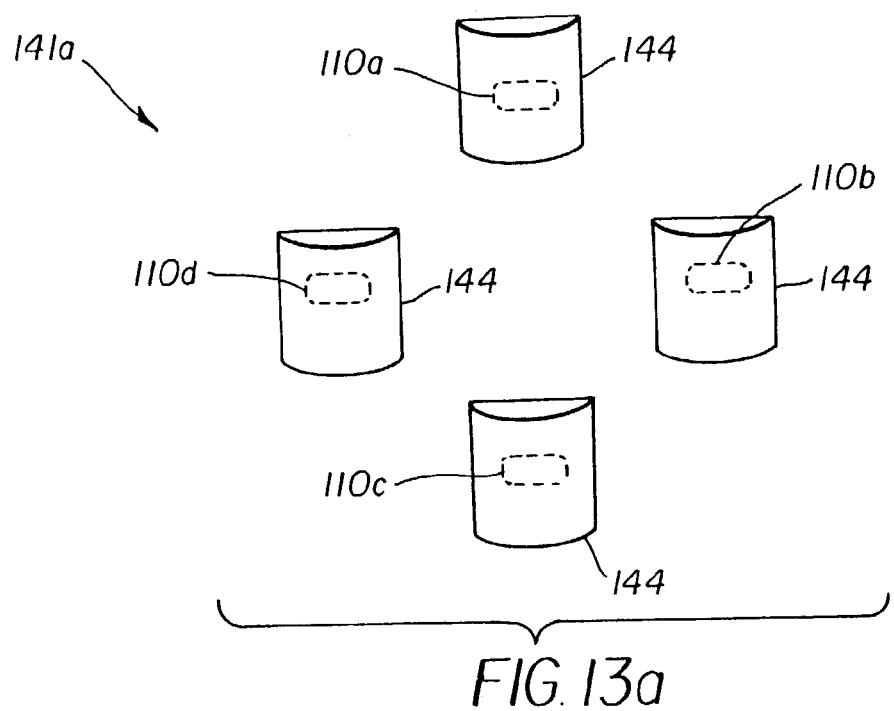
Figure 13B:
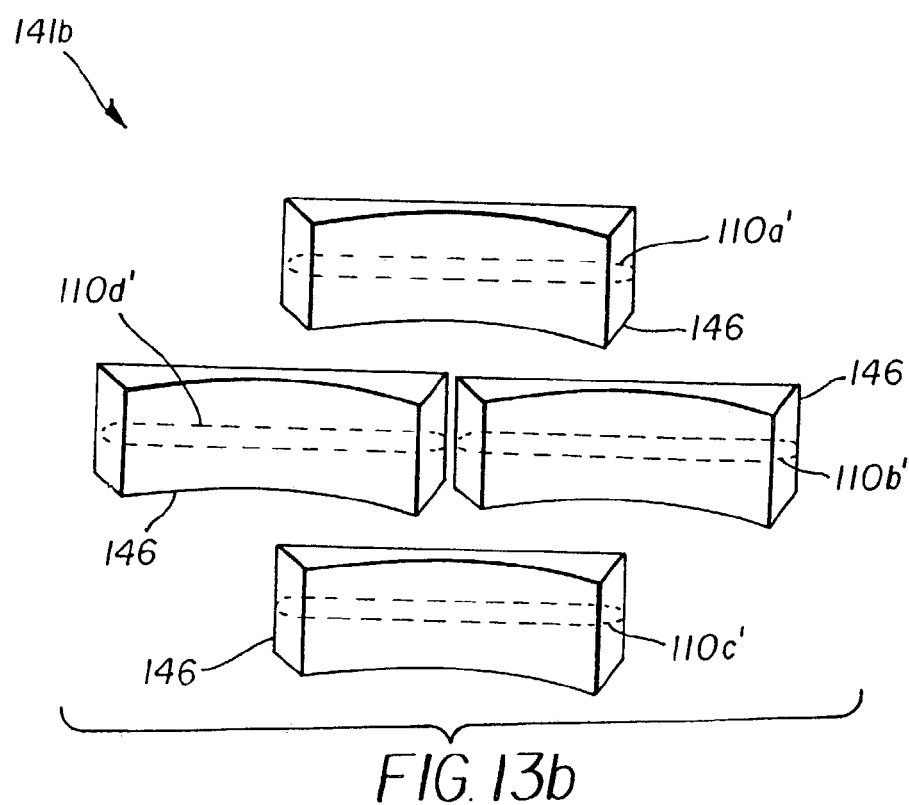

FIGS. 13a and 13b show, as partial perspective views, the respective arrangements of cylindrical lens array 141a and collimator lens array 141b in microlens converter 140 of FIG. 11, according to the present invention. Referring to FIG. 13a, cylindrical lens array 141a comprises an arrangement of cylindrical microlens elements 144, suitably arranged for aspect ratio adjustment. As indicated by dotted lines, a cylindrical microlens element 144 is deployed in the spatial position of each lobe 110a–110d. Referring to FIG. 13b, collimator lens array 141b comprises an arrangement of collimator microlens elements 146 corresponding to the positional arrangement of cylindrical microlens elements 144 used in cylindrical lens array 141a. The combination of cylindrical microlens elements 144 and collimator microlens elements 146, corresponding to each of the lobes 110a–110d of emitted light, conditions the aspect ratio of lobes 110a–110d, as represented in FIG. 12a, to the more linear aspect ratio of conditioned lobes 110a', 110b', 110c', and 110d' as represented in FIG. 12b.

The invention has been described in detail with particular reference to certain embodiments thereof, but it will be understood that variations and modifications can be effected within the scope of the invention as described above, and as noted in the appended claims, by a person of ordinary skill in the art without departing from the scope of the invention. For example, imaging apparatus 10 could have some VCSEL arrays 100 operating in out-of-phase configuration while other VCSEL arrays 100 operate in phase-locked configuration. Furthermore, although the above embodiments have been described for a specific orientation of the axes of symmetry of VCSEL array 100, a different orientation could be used with corresponding modifications to the imaging apparatus 10. While organic VCSEL arrays 100 are used in one embodiment, conventional non-organic VCSEL arrays 100 could alternatively be used. Imaging apparatus 10 could employ conventional imaging, in which modulated diffracted light is directed to surface 90 or reflected light imaging, in which the zeroeth order reflected light from electromechanical grating light modulator 85 forms the image. For increased color gamut, more than three VCSEL array 100 color light sources could be used.

Scanning mirror 77 serves as the scanning element in the embodiments described. However, other suitable scanning elements could be used, including various types of prisms, rotating polygon mirrors, and optoelectronic beam steering devices, for example. As an alternative arrangement for forming a scanned, two-dimensional display image, a planar optical waveguide could be employed, as is described in U.S. Pat. No. 5,381,502, issued Jan. 10, 1995, titled "Flat Or Curved Thin Optical Display Panel," by Veligdan for example, for which scanning mirror 77 might be configured as a rotating polygon mirror. For printing apparatus, a media transport mechanism can be utilized for scanning and advancing a medium in the path of modulated light at a suitable rate for forming a two-dimensional image.

FIGS. 6, 8, and 9 show arrangements of components in embodiments where the electromechanical grating light modulator 85 is a GEMS device, according to the present invention. A rearrangement of components would be needed to adapt these configurations for use with GLV devices, using techniques known in the optical design art and described in the background material of U.S. Pat. No. 6,411,425. With respect to FIG. 9, for example, a single spatial filter 134 would be positioned at the Fourier plane of projection lens 75, rather than using spatial filters 134 in each color modulation path. In FIG. 6, for example, turning mirror 82 would be positioned in the Fourier plane of projection lens 75 with GLV modulation. FIG. 8 would also require a single turning mirror 82 at the Fourier plane of projection lens 75 and would involve a complex light path, where precombined light is directed to turning mirror 82, separated into its component colors at color combiner 73, then modulated, then recombined as a modulated light beam, with its diffracted orders projected past turning mirror 82 to scanning mirror 77.

The apparatus and methods of the present invention have been described for providing modulated light in imaging applications, in apparatus such as printers, projectors, and display devices. However, it must be emphasized that the apparatus of the present invention could be employed in other types of imaging devices as well as in other apparatus that utilize modulated laser light energy for a variety of functions, such as sensing or recording functions, for example.

Thus, what is provided is an apparatus for modulating a light beam from a VCSEL laser source at an electromechanical grating device and scanning one or more diffracted orders of the light beam onto a surface.

PARTS LIST 10 imaging apparatus
20 light source
20r red light source
20g green light source
20b blue light source
73 color combining element
74 cylindrical lens
75 lens
77 scanning mirror
80 control logic processor
82 turning mirror
85 electromechanical grating light modulator
85r electromechanical grating light modulator, red
85g electromechanical grating light modulator, green
85b electromechanical grating light modulator, blue
90 surface
100 VCSEL array
100r VCSEL array, red
100g VCSEL array, green
100b VCSEL array, blue
102 VCSEL emissive elements
103 VCSEL emissive elements
105 source beam
107 conditioned source beam
109 illumination beam
110a lobe
110b lobe
110c lobe
110d lobe
110a' conditioned lobe
110b' conditioned lobe
110c' conditioned lobe
110d' conditioned lobe
110e central lobe
112a overlap area
112b overlap area
112c overlap areas
120 modulation assembly
120r red modulation assembly
120g green modulation assembly
120b blue modulation assembly
122 Fourier transform lens
124 lens
126 lens assembly
130 illumination spatial filter
132 aperture
134 modulated light spatial filter
136 aperture
138 aperture
140 microlens converter
141a cylindrical lens array
141b collimator lens array
142 lens
144 cylindrical microlens element
146 collimator microlens element
160 cross-order filter
210a zeroeth order reflected beam 210b zeroeth order reflected beam
210c zeroeth order reflected beam
210d zeroeth order reflected beam
210a+ diffracted order
210a− diffracted order
210b+ diffracted order
210b− diffracted order
210c+ diffracted order
210c− diffracted order
210d+ diffracted order
210d− diffracted order

What is claimed is:

1. An apparatus for providing modulated light, comprising:
   (a) a VCSEL array for generating an illumination beam from a plurality of emissive elements within the VCSEL array;
   (b) a linear array of electromechanical grating devices for modulating the illumination beam to provide a plurality of diffracted orders;
   (c) an obstructing element for blocking at least one of the plurality of diffracted orders; and
   (d) means for conditioning the illumination beam to provide a suitable aspect ratio for incidence onto the linear array of electromechanical grating devices and/or remove unwanted spatial content.

2. The apparatus according to claim 1 wherein the VCSEL array is an organic VCSEL array.

3. The apparatus according to claim 1 wherein the VCSEL array is optically pumped.

4. The apparatus according to claim 1 wherein light emitted from each of the plurality of emissive elements within the VCSEL array has the same phase.

5. The apparatus according to claim 1 wherein light emitted from an emissive element within the VCSEL array and light emitted from a neighboring emissive element have opposite phase.

6. The apparatus according to claim 1 wherein the linear array of electromechanical grating devices is a grating light valve.

7. The apparatus according to claim 1 wherein the linear array of electromechanical grating devices is a conformal GEMS device.

8. The apparatus according to claim 1 wherein the obstructing element also directs the illumination beam toward the linear array of electromechanical grating devices.

9. The apparatus according to claim 1 wherein the obstructing element blocks a zeroeth order light beam.

10. The apparatus according to claim 1 wherein the obstructing element blocks at least one non-zeroeth light beam.

11. The apparatus according to claim 10 wherein the obstructing element blocks at least one first order light beam.

12. The apparatus according to claim 1, wherein the means for conditioning the illumination beam includes an illumination spatial filter for providing a set of lobes of light emitted from the VCSEL array as the illumination beam.

13. The apparatus according to claim 1, wherein the means for conditioning the illumination beam includes a lens for imaging the VCSEL array onto the linear array of electromechanical grating devices.

14. An imaging apparatus for forming an image onto a surface comprising:
   (a) a light source comprising at least a first VCSEL array with emissive elements for providing an illumination beam along an illumination axis;
   (b) a linear array of electromechanical grating devices for modulating the illumination beam, according to image data, to provide a modulated beam comprising a plurality of diffracted orders;
   (c) an obstructing element for blocking at least one of the diffracted orders from the modulated beam;
   (d) means for conditioning the illumination beam to provide a suitable aspect ratio for incidence onto the linear array of electromechanical grating devices and/or remove unwanted spatial content; and
   (e) a projection lens cooperating with a scanning element for directing the modulated beam toward the surface, thereby forming a line image on the surface.

15. The apparatus according to claim 14 wherein the first VCSEL array is an organic VCSEL array.

16. The apparatus according to claim 14 wherein the first VCSEL array is optically pumped.

17. The apparatus according to claim 14 wherein light emitted from each emissive element within the first VCSEL array has the same phase.

18. The apparatus according to claim 14 wherein light emitted from an emissive element within the VCSEL array and light emitted from a neighboring emissive element have opposite phase.

19. The apparatus according to claim 14 wherein the linear array of electromechanical grating devices is a grating light valve.

20. The apparatus according to claim 14 wherein the linear array of electromechanical grating devices is a conformal GEMS device.

21. The apparatus according to claim 14 wherein the obstructing element also directs the illumination beam toward the linear array of electromechanical grating devices.

22. The apparatus according to claim 14 wherein the obstructing element blocks a zeroeth order light beam.

23. The apparatus according to claim 14 wherein the obstructing element blocks at least one first order light beam.

24. The apparatus according to claim 14 wherein the obstructing element blocks at least one non-zeroeth order light beam.

25. The apparatus according to claim 14 further comprising a lens for imaging the first VCSEL array onto the linear array of electromechanical grating devices.

26. The apparatus according to claim 24 wherein the projection lens conditions an aspect ratio of the first VCSEL array.

27. The apparatus according to claim 14 wherein the scanning element is taken from the group consisting of rotating mirror, polygon mirror, prism, electrooptic beam steering component, and media transport means.

28. The imaging apparatus according to claim 14 wherein the surface is a front projection screen.

29. The imaging apparatus according to claim 14 wherein the surface is a rear projection screen.

30. The imaging apparatus according to claim 14 wherein the surface comprises a planar optical waveguide.

31. The imaging apparatus according to claim 14 wherein the surface is a photosensitive medium.

32. The imaging apparatus according to claim 31 wherein the photosensitive medium is taken from the group consisting of photographic media, electrophotographic media, and thermal media.

33. The imaging apparatus according to claim 14 further comprising
   (e) a logic control processor for providing the image data to the linear array of electromechanical grating devices according to positioning of the scanning element.

34. The imaging apparatus according to claim 14 wherein the means for conditioning the illumination beam includes an illumination spatial filter.

35. The imaging apparatus according to claim 34 wherein the light source further includes a Fourier transform lens for directing light from the first VCSEL array to the illumination spatial filter.

36. The imaging apparatus according to claim 14 wherein the first VCSEL array emits a source beam having at least one lobe and wherein the light source further comprises:
 (i) a Fourier transform lens for directing the source beam toward a converter element disposed near the Fourier plane of the Fourier transform lens, the converter element modifying the aspect ratio of the at least one lobe to provide a modified source beam; and,
 (ii) a lens for providing the modified source beam as the illumination beam.

37. The imaging apparatus according to claim 14 wherein the first VCSEL array emits a first source beam having a first color and the light source further comprises:
 (a) a second VCSEL array for emitting a second source beam having a second color;
 (b) a third VCSEL array for emitting a third source beam having a third color; and
 (c) a color combining element for directing the first, the second, and the third source beams onto the illumination axis.

38. The imaging apparatus according to claim 37 wherein the light source further comprises a Fourier transform lens for directing light on the illumination axis toward an illumination spatial filter.

39. The imaging apparatus according to claim 36 wherein the converter element comprises a microlens array.

40. An imaging apparatus for forming an image onto a surface comprising:
 (a) a first, second, and third color modulation assembly, each of the modulation assemblies providing an imaging light beam having a first, a second, or a third color, respectively, and each of the modulation assemblies comprising:
  (i) a VCSEL array for generating an illumination beam from a plurality of emissive elements within the VCSEL array;
  (ii) a linear array of electromechanical grating devices for modulating the illumination beam according to image data to provide a modulated beam comprising a plurality of diffracted orders;
  (iii) an obstructing element for blocking at least one of the plurality of diffracted orders from the modulated beam to provide the imaging light beam; and
  (iv) means for conditioning the illumination beam to provide a suitable aspect ratio for incidence onto the linear array of electromechanical grating devices and/or remove unwanted spatial content;
 (b) a color combining element for combining, along a single output axis, the first, the second, and the third color imaging light beams to form a multicolor modulated beam; and
 (c) a lens element cooperating with a scanning element for directing the multicolor modulated beam toward the surface, thereby forming a multicolor line image on the surface.

41. The apparatus according to claim 40 wherein the VCSEL array is an organic VCSEL array.

42. The apparatus according to claim 40 wherein the VCSEL array is optically pumped.

43. The apparatus according to claim 40 wherein light emitted from each of the plurality of emissive elements within the VCSEL array has the same phase.

44. The apparatus according to claim 40 wherein light emitted from an emissive element within the VCSEL array and light emitted from a neighboring emissive element have opposite phase.

45. The apparatus according to claim 40 wherein the linear array of electromechanical grating devices is a conformal GEMS device.

46. The apparatus according to claim 40 wherein the obstructing element also directs the illumination beam toward the linear array of electromechanical grating devices.

47. The apparatus according to claim 40 wherein the obstructing element blocks a zeroeth order light beam.

48. The apparatus according to claim 40 wherein the obstructing element blocks at least one non-zeroeth light beam.

49. The apparatus according to claim 48 wherein the obstructing element blocks at least one first order light beam.

50. The apparatus according to claim 40, wherein the means for conditioning the illumination beam includes a lens for imaging the VCSEL array onto the linear array of electromechanical grating devices.

51. The apparatus according to claim 50 wherein the lens conditions an aspect ratio of the VCSEL array.

52. The apparatus according to claim 40 wherein the scanning element is selected from the group consisting of a rotating mirror, a polygon mirror, a prism, an electrooptic beam steering component, and a media transport means.

53. The imaging apparatus according to claim 40 wherein the surface is a front projection screen.

54. The imaging apparatus according to claim 40 wherein the surface is a rear projection screen.

55. The imaging apparatus according to claim 40 wherein the surface comprises a planar optical waveguide.

56. The imaging apparatus according to claim 40 wherein the surface is a photosensitive medium.

57. The imaging apparatus according to claim 56 wherein the photosensitive medium is selected from the group consisting of a photographic media, an electrophotographic media, and a thermal media.

58. The imaging apparatus according to claim 40, further comprising:
 (e) a logic control processor for providing the image data to each of the linear array of electromechanical grating devices according to positioning of the scanning element.

59. The imaging apparatus according to claim 40 wherein the color modulation assembly includes an illumination spatial filter for conditioning the illumination beam.

60. The imaging apparatus according to claim 59 wherein the color modulation assembly further includes a Fourier transform lens for directing light from the VCSEL array to the illumination spatial filter.

61. The imaging apparatus according to claim 40 wherein the color modulation assembly emits a source beam having at least one lobe and wherein the color modulation assembly further comprises:
 (i) a Fourier transform lens for directing the source beam toward a converter element disposed near the Fourier plane of the Fourier transform lens, said converter element modifying an aspect ratio of the at least one lobe to provide a modified source beam; and,
 (ii) a lens for providing the modified source beam as the illumination beam.

62. The imaging apparatus according to claim 40 wherein the color combining element is selected from the group consisting of X-cube and Philips prism.

63. The imaging apparatus according to claim 40 wherein the color combining element comprises an arrangement of dichroic surfaces.

64. The imaging apparatus according to claim 61 wherein the converter element comprises a microlens array.

65. A method for providing a modulated light beam comprising:
(a) generating an illumination beam from a VCSEL array having a plurality of emissive elements within the VCSEL array;
(b) modulating the illumination beam at a linear array of electromechanical grating devices to provide a plurality of diffracted orders;
(c) blocking at least one of the plurality of diffracted orders to form the modulated light beam; and
(d) conditioning the illumination beam to provide a suitable aspect ratio for incidence onto the linear array of electromechanical grating devices and/or remove unwanted spatial content.

66. The method for providing a modulated light beam according to claim 65 wherein the VCSEL array is an organic VCSEL array.

67. The method for providing a modulated light beam according to claim 65 wherein the step of generating the illumination beam comprises the step of optically pumping the VCSEL array.

68. The method for providing a modulated light beam according to claim 65 wherein the step of generating the illumination beam from the VCSEL array activates neighboring emissive elements of the VCSEL array for emission at the same phase.

69. The method for providing a modulated light beam according to claim 65 wherein the step of generating the illumination beam from the VCSEL array activates neighboring emissive elements of the VCSEL array for emission at the opposite phase.

70. The method for providing a modulated light beam according to claim 65 wherein the linear array of electromechanical grating devices is a grating light valve.

71. The method for providing a modulated light beam according to claim 65 wherein the linear array of electromechanical grating devices is a conformal GEMS device.

72. The method for providing a modulated light beam according to claim 65 wherein the step of blocking the at least one of the plurality of diffracted orders comprises the step of blocking a zeroeth diffracted order.

73. The method for providing a modulated light beam according to claim 65 wherein the step of blocking the at least one of the plurality of diffracted orders comprises the step of blocking at least one non-zeroeth diffracted order.

74. The method for providing a modulated light beam according to claim 73 wherein the step of blocking the at least one of the plurality of diffracted orders comprises the step of blocking a first diffracted order.

75. The method for providing a modulated light beam according to claim 65 wherein the step of conditioning the illumination beam further comprises the step of providing an illumination spatial filter for providing a set of lobes of light emitted from the VCSEL array as the illumination beam.

76. The method for providing a modulated light beam according to claim 65 wherein the step of generating the illumination beam comprises the step of imaging the VCSEL array onto the linear array of electromechanical grating devices.

77. The method for providing a modulated light beam according to claim 76 wherein the step of imaging the VCSEL array further comprises the step of anamorphically magnifying the VCSEL array.

78. A method for forming an image onto a surface, comprising the steps of:
(a) providing an illumination beam from a VCSEL array with a plurality of emissive elements within the VCSEL array, wherein the VCSEL array is activated by a source beam;
(b) conditioning the source beam to remove unwanted spatial content;
(c) modulating the illumination beam at a linear array of electromechanical grating devices according to image data to provide a plurality of diffracted orders;
(d) blocking at least one of the plurality of diffracted orders to provide an imaging beam; and,
(e) projecting the imaging beam toward the surface.

79. The method for forming an image according to claim 78 wherein the step of conditioning the source beam further comprises the step of filtering the source beam to remove unwanted spatial content.

80. The method for forming an image according to claim 78 wherein the step of projecting the imaging beam further comprises the step of directing the imaging beam toward a scanning element.

81. The method for forming an image according to claim 78 wherein the VCSEL array is an organic VCSEL array.

82. The method for forming an image according to claim 78 wherein the step of providing the illumination beam comprises the step of optically pumping the VCSEL array.

83. The method for forming an image according to claim 78 wherein the step of providing the illumination beam from the VCSEL array activates neighboring emissive elements of the VCSEL array for emission at the same phase.

84. The method for forming an image according to claim 78 wherein the step of providing the illumination beam from the VCSEL array activates neighboring emissive elements of the VCSEL array for emission at the opposite phase.

85. The method for forming an image according to claim 78 wherein the linear array of electromechanical grating devices is a grating light valve.

86. The method for forming an image according to claim 78 wherein the linear array of electromechanical grating devices is a conformal GEMS device.

87. The method for forming an image according to claim 78 wherein the step of blocking the at least one of the plurality of diffracted orders comprises the step of blocking a zeroeth diffracted order.

88. The method for forming an image according to claim 78 wherein the step of blocking the at least one of the plurality of diffracted orders comprises the step of blocking at least one non-zeroeth diffracted order.

89. The method for forming an image according to claim 88 wherein the step of blocking the at least one of the plurality of diffracted orders comprises the step of blocking a first diffracted order.

90. The method for forming an image according to claim 79 wherein the step of filtering the source beam further comprises the step of providing an illumination spatial filter for providing a set of lobes of light emitted from the VCSEL array as the illumination beam.

91. The method for forming an image according to claim 90 further comprising the step of positioning a Fourier transform lens for directing light from the VCSEL array to the illumination spatial filter.

92. The method for forming an image according to claim 78 wherein the step of providing the illumination beam comprises the step of imaging the VCSEL array onto the linear array of electromechanical grating devices.

93. The method for forming an image according to claim 92 wherein the step of imaging the VCSEL array further comprises the step of anamorphically magnifying the VCSEL array.

94. The method for forming an image according to claim 78 wherein the surface is selected from the group consisting of a front projection screen, a rear projection screen, and a planar optical waveguide.

95. The method for forming an image according to claim 78 wherein the surface is a photosensitive medium.

96. The method for forming an image according to claim 95 further comprising the step of transporting the photosensitive medium in the path of the imaging beam.

97. The method for forming an image according to claim 78 wherein the step of providing an illumination beam from the VCSEL array comprises the step of directing emitted light through a color combining element.

98. An apparatus for providing modulated light, comprising:

(a) a laser array having a phase configuration for generating an illumination beam from a plurality of emissive elements within the phase-locked laser array;

(b) a linear array of electromechanical grating devices for modulating the illumination beam to provide a plurality of diffracted orders;

(c) an obstructing element for blocking at least one of the plurality of diffracted orders; and (d) an illumination spatial filter for conditioning the illumination beam from the laser array having a phase configuration.

99. The apparatus claimed in claim 98, wherein the laser array having a phase configuration is a VCSEL array.

100. The apparatus claimed in claim 98, wherein the laser array having a phase configuration is either an out-of-phase laser array or a phase-locked laser array.

101. The apparatus claimed in claim 98, further comprising: (e) a Fourier transform lens for directing light from the laser array having a phase configuration to the illumination spatial filter.

* * * * *